United States Patent [19]
Hirose

[11] Patent Number: 5,436,205
[45] Date of Patent: Jul. 25, 1995

[54] METHOD OF FORMING ELECTRODE IN SEMICONDUCTOR DEVICE

[75] Inventor: Tatsuya Hirose, Kawasaki, Japan
[73] Assignee: Fujitsu Limited, Kawasaki, Japan
[21] Appl. No.: 102,823
[22] Filed: Aug. 6, 1993

[30] Foreign Application Priority Data

Jan. 11, 1993 [JP] Japan .................. 5-002617

[51] Int. Cl.⁶ .................................. H01L 21/465
[52] U.S. Cl. .................... 437/228; 437/184; 437/192; 437/200
[58] Field of Search ............ 437/187, 200, 228, 245, 437/184, 192; 156/643, 646, 651, 652, 656

[56] References Cited

U.S. PATENT DOCUMENTS

| | | | |
|---|---|---|---|
| 4,528,066 | 7/1985 | Merkling, Jr. et al. | 156/643 |
| 4,529,475 | 7/1985 | Okano et al. | 156/643 |
| 4,713,141 | 12/1987 | Tsang | 156/643 |
| 4,886,569 | 12/1989 | Ojha et al. | 156/643 |
| 5,017,265 | 5/1991 | Park et al. | 156/643 |
| 5,110,408 | 5/1992 | Fujii et al. | 156/643 |
| 5,143,866 | 9/1992 | Matsutani | 437/187 |
| 5,185,058 | 2/1993 | Cathey, Jr. | 156/656 |
| 5,236,549 | 8/1993 | Shirakawa et al. | 156/643 |
| 5,259,923 | 11/1993 | Hori et al. | 156/643 |

OTHER PUBLICATIONS

Low-Temperature Dry Etching; Shin-ichi Tachi and Kazunori Tsujimoto; IEEE Tokyo Section, Denshi, Tokyo No. 30 (1991) pp. 25-29.

Primary Examiner—Olik Chaudhuri
Assistant Examiner—H. Jey Tsai
Attorney, Agent, or Firm—Armstrong, Westerman, Hattori, McLeland & Naughton

[57] ABSTRACT

In a process of patterning a conductive film on a semiconductor layer using a mask, thereby to form an electrode, first, anisotropic etching is applied to a conductive film which is not covered by a mask under ambient atmosphere at a high pressure in an almost perpendicular direction, and conductive film materials sublimated by the etching are redeposited on a side wall of a conductive film under the mask. Lastly, the conductive film on the semiconductor layer and redeposited metal are etched isotropically by etchant having low energy under ambient atmosphere where the pressure is reduced, thus having the semiconductor layer exposed from the area which is not covered by the mask.

11 Claims, 7 Drawing Sheets

5,436,205

METHOD OF FORMING ELECTRODE IN SEMICONDUCTOR DEVICE

BACKGROUND OF THE INVENTION

1. Field of the Invention

The present invention relates to a method of forming an electrode in a semiconductor device, and more particularly to a method of forming a fine electrode on a compound semiconductor layer or an element semiconductor layer constituting a semiconductor device by dry etching techniques.

2. Description of the Related Art

When a gate electrode for a very fine field effect transistor is formed, it is required to form the configuration thereof as expected by patterning a metallic film by using dry etching techniques.

As a method of forming the gate electrode, for example, photoresist 2 is applied onto a metallic film 1 as shown in FIG. 1(a), the photoresist 2 is exposed and developed so as to apply patterning to obtain a desired gate electrode size, and then the metallic film 1 exposed from the photoresist 2 is removed by a reactive ion etching method, thereby to form the metallic film 1 into a configuration of a gate electrode 3.

When etching is performed, the pressure of the ambient atmosphere is set lower than 0.1Pa and gas having very heavy molecular weight or atomic weight is used as etching gas, and also, when plasma is generated in etching, etching conditions are set so that the self-bias thereof becomes 200 V to 400 V. It has been known that etching is performed by striking the metallic film with atoms or molecules having very large energy.

As a result, the configuration of the gate electrode 3 becomes fairly sharp as shown in FIG. 1(b), thus making it possible to produce the gate electrode 3 to such an extent that a border line between a surface of a semiconductor layer 4 and the gate electrode 3 is identified clearly.

In this method, however, since atoms or molecules having very large energy strike the surface of the semiconductor layer 4 around the gate electrode 3, damage is introduced into the semiconductor layer 4, thus deteriorating characteristics of the semiconductor element.

Further, there is such a problem that, in case surface state is formed in a semiconductor layer when a gate electrode of a MESFET or other field effect transistor is formed, a source resistance becomes high.

For example, in a High Electron Mobility Transistor (HEMT), the surface state of the semiconductor layer is increased by the damage, and electrons are caught by the state. As a result, two-dimensional electron gas generated at an interface between an electron supply layer and an electron travelling layer under the semiconductor layer is decreased, and good transistor characteristics are unobtainable.

As against the above, it has been proposed to apply etching in which a chemical reaction is dominant using atoms, molecules or radicals having low energy (reference data: Shin-ichi Tachi and Kazunori Tsujimoto IEEE TOKYO SECTION, Denshi, Tokyo No. 30 (1991) pp. 25–29).

Although the semiconductor layer suffers no damage according to this proposal, isotropic etching is applied to the metallic film since a chemical reaction is dominant, and the pattern of the gate electrode 3 becomes narrower than the pattern of the photoresist 2 as shown in FIG. 1(c).

SUMMARY OF THE INVENTION

It is an object of the present invention to provide a method of forming an electrode in which when an electrode is formed on a semiconductor layer, the surface of the semiconductor layer suffers no damage, and moreover, the electrode does not become thinner than a mask pattern.

According to the present invention, anisotropic etching is applied to a semiconductor film almost in a perpendicular direction by increasing the pressure of the ambient atmosphere so as to make the semiconductor film thinner, and conductive film materials sublimated by the etching are redeposited on a side portion of the conductive film under the mask pattern. Thereafter, the conductive film exposed from the mask pattern is removed by isotropic etching, and the conductive film materials attached to the side portion of the conductive film under the mask pattern are also removed. Thus, an electrode pattern is formed.

In this case, since the film thickness of the redeposited conductive film materials is made equal to or thicker than the thickness remaining on the surface of the semiconductor layer, the conductive materials redeposited on the side wall of the conductive film under the mask pattern disappear or remain very slightly at a point of time when the conductive film in the area which is not covered by the mask pattern is removed. With this, the conductive film applied with patterning under the mask pattern does no longer become thinner, and the electrode shows a desired configuration.

Further, the surface of the semiconductor layer is not exposed while the conductive film is being etched in an almost perpendicular direction, and no damage is introduced into the semiconductor layer even if atoms or molecules having high energy are used.

Moreover, since isotropic etching used in the end of patterning is performed by etching in which atoms or molecules having low energy are used and a chemical reaction is dominant, the semiconductor layer suffers almost no damage, and an electrode having a sharp configuration is formed without damaging the semiconductor layer at all.

Besides, in order to redeposit the conductive film materials on the side wall of the conductive film applied with patterning, it is sufficient to increase the pressure of the ambient atmosphere at least in anisotropic etching to higher than a normal state.

DESCRIPTION OF THE PREFERRED EMBODIMENTS

First, it is examined to form a gate electrode by a method described hereunder by utilizing a prior art. Besides, this method is not publicly known.

Figure 1A:
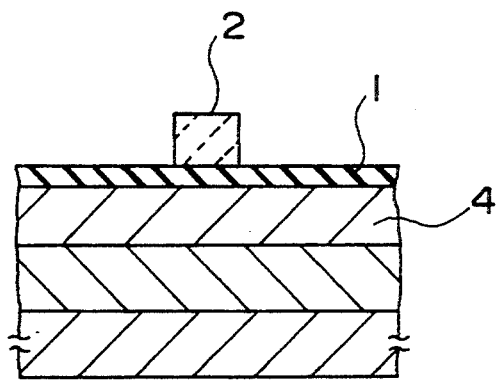
FIG. 1(a) to FIG. 1(c) are sectional views showing a manufacturing process of an electrode of a semiconductor device according to a prior art.
Figure 1B:
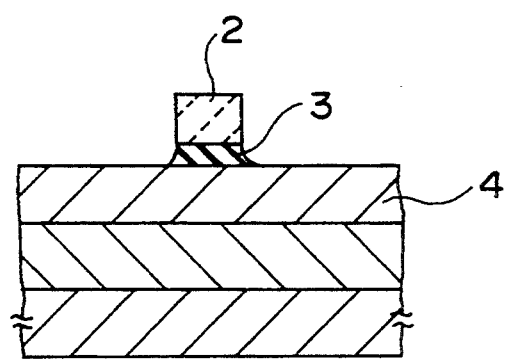
Figure 1C:
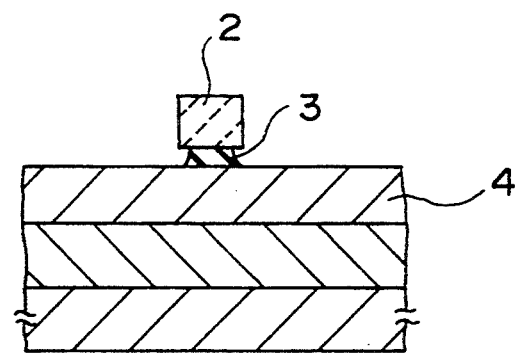
Figure 2A:
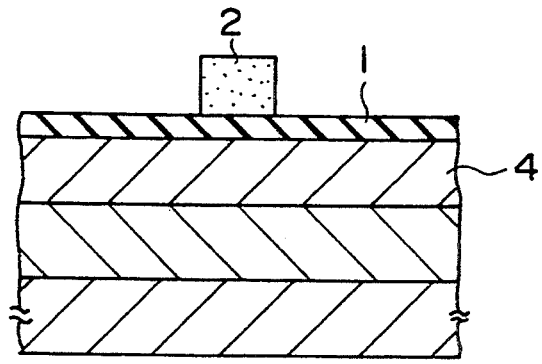
FIG. 2(a) to FIG. 2(c) are sectional views showing a manufacturing process of an electrode of a semiconductor device utilizing a prior art.
Figure 2B:
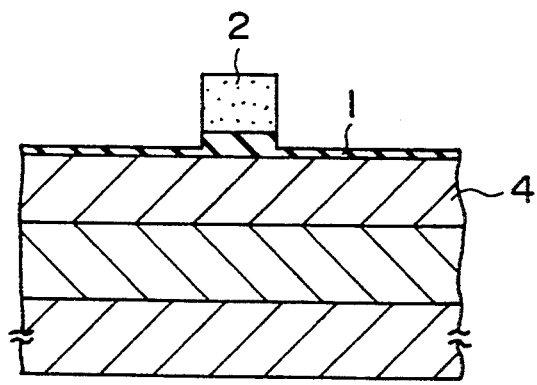
Figure 2C:
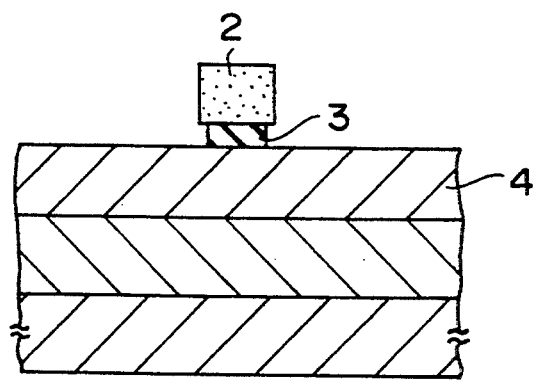

First, as shown in FIG. 2(a), a metallic film exposed from photoresist 2 is etched by a reactive ion etching method using atoms or molecules having high energy, and the etching is stopped before reaching a surface of a semiconductor layer 4 (FIG. 2(b)). Then, reaction gas only is changed to gas of atoms or molecules having low energy, in other words, gas in which a chemical reaction is dominant is used, and plasma etching is applied to the remaining metallic film 1 as shown in FIG. 2(c).

Figure 3:
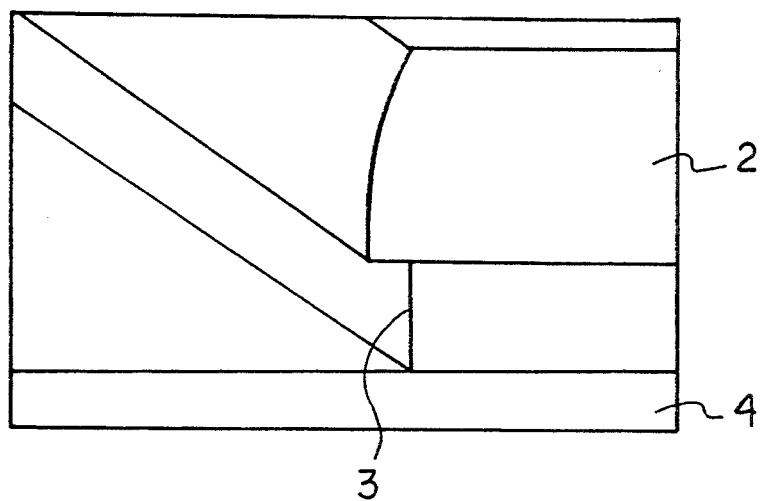
FIG. 3 is a sectional view depicted based on a photograph of a patterning state of an electrode of a semiconductor deuce formed by applying a prior art.

According to this process, the damage introduced into the surface of the semiconductor layer 4 is restrained considerably, but the etching is advanced isotropically when the metallic film 1 is etched through a chemical reaction. Therefore, side wall surfaces of the photoresist (covering material) 2 and the metallic film 1 thereunder do not become flush with each other, and the gate length becomes short, thus making it impossible to obtain desired threshold voltage. The sectional state thereof is shown in FIG. 3.

The extent of reduction in the gate length is smaller than that when only isotropic etching is applied and slight improvement is shown, which, however, is inferior to a case when only anisotropic etching is applied.

So, the present inventor has invented such a method of forming a gate electrode as explained hereunder. An embodiment of the present invention will be described hereinafter with reference to the drawings.

Figure 4A:
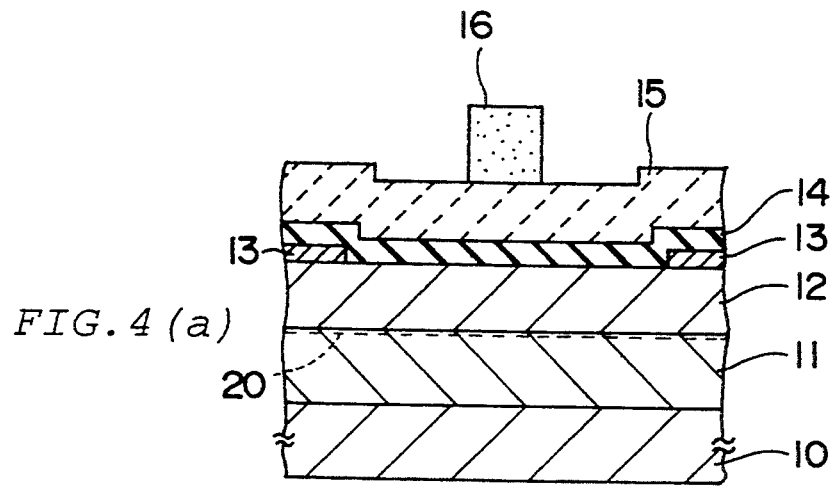
FIG. 4(a) to FIG. 4(g) are sectional views showing the change in a process of forming an electrode of a semiconductor device according to an embodiment of the present invention.

First, the process until the state shown in FIG. 4(a) is reached will be described.

A GaAs substrate is used for instance as a semi-insulating substrate 10 on which a semiconductor element is formed, and an undoped GaAs layer 11, a Si-doped n-AlGaAs layer 12 and an n+-InGaAs layer 13 are grown epitaxially thereon in consecutive order in the thickness of 4,000Å, 300Å and 700Å, respectively, as a semiconductor layer. In this case, the undoped GaAs layer 11 becomes an electron travelling layer, and the n-AlGaAs layer 12 becomes an electron supply layer and the n+-InGaAs layer 13 becomes a cap layer.

Thereafter, patterning is applied to the InGaAs layer 13 by wet etching using a mask, and this layer is made to remain in a source region and a drain region.

Next, a metallic film which becomes a gate electrode such as a WSi film 14 is deposited in a thickness of 1,500Å by a sputtering method.

Then, a silicon oxide nitride (SION) film 15 for instance is grown in a thickness of 6,000Å as an insulating film on the WSi film 14 using a plasma CVD method. Furthermore, resist (coating material) 16 is applied onto the SiON film 15 by a spin coating method as a surface coating material and is exposed and developed, thereby to form a pattern which covers the gate region. With this, a sectional configuration shown in FIG. 4(a) is obtainable.

Figure 5:
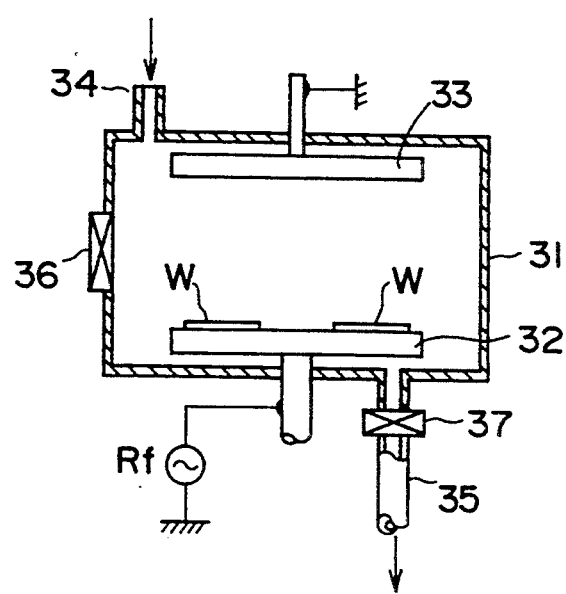
FIG. 5 is a schematic block diagram showing an example of a dry etching apparatus used in an embodiment of the present invention.

Next, a process of transcribing the pattern of the resist 16 to the WSi film 14 using such a dry etching apparatus 30 as shown in FIG. 5 is started.

The dry etching apparatus 30 includes an etching chamber 31, a first electrode 32 for placing articles W to be etched in the etching chamber 31, a second electrode 33 arranged thereabove and opposing to the articles W to be etched, a high frequency power source $R_f$ connected to these electrodes 32 and 33, a gas inlet pipe 34 and an exhaust pipe 35 connected to the etching chamber 31, and a wafer entrance door 36.

First, the semi-insulating substrate 10 is put in the etching chamber 31 and the pressure inside thereof is reduced. Thereafter, gas obtained by mixing $CHF_3$, $C_2H_4$ and He for instance is used as the first etching gas, and anisotropic dry etching is applied to the SiON film 15 exposed from the resist pattern 16 by a reactive ion etching method and the pattern thereof is transcribed.

Figure 4B:
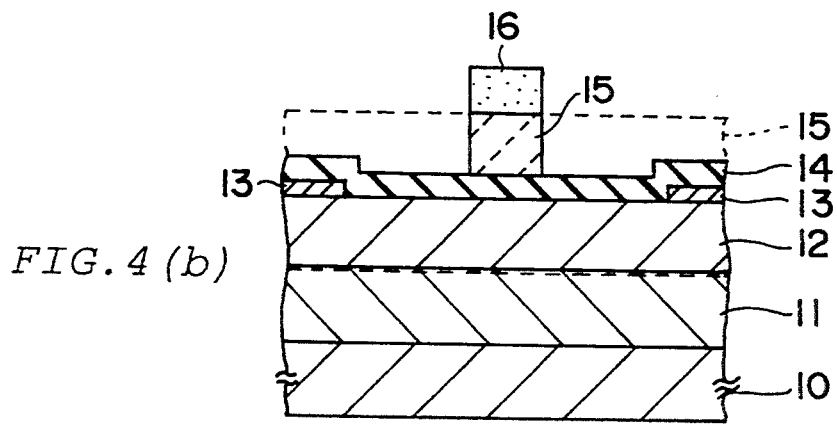

With this, a part of the WSi film 14 is exposed from the resist pattern 16 as shown in FIG. 4(b), and the resist pattern 16 is also formed into a thin layer. However, this process is performed under such a condition that the WSi film 14 is not shaved in etching. For example, $CHF_3$, $C_2H_4$ and He are introduced at 15 sccm, 15 sccm and 30 sccm, respectively, or at a mixing ratio thereof as the flow rate of the etching gas.

Besides, $C_2F_6$ and $CCl_2F_2$ are available other than the above as the etching gas of the SiON film 15. Further, wet etching may also be adopted in case the foregoing can be achieved by using chemicals such as hydrofluoric acid.

Figure 4C:
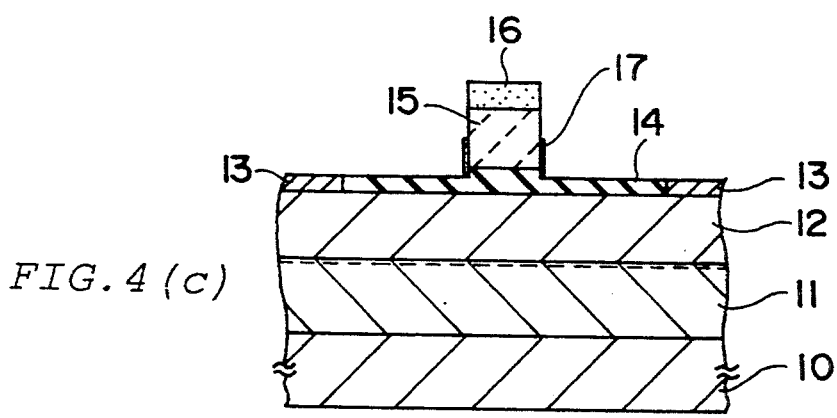
Figure 4D:
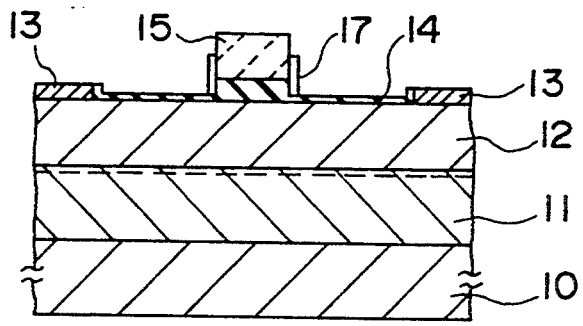

Thereafter, when an unnecessary portion exposed from the pattern of the SiON film 15 in the WSi film 14 which is a metallic film that becomes a gate electrode is formed into a thin layer by applying anisotropic etching, the sectional configuration changes from FIG. 4(c) to FIG. 4(d).

The etching conditions are such that $CF_4$ and $O_2$ for instance are introduced at the flow rates of 20 sccm and 9 sccm or at a mixing ratio in the proportion thereof as the etching gas. Further, the pressure in the etching chamber is controlled by regulating a valve 37 or the like attached to the dry etching apparatus 30, thereby to set the pressure at a pressure higher than normal of 0.1 Pa or above to 1.0 Pa or below, preferably at 0.5 Pa.

Further, the discharge power of the high frequency power source $R_f$ of 13.56 MHz is set to 20 W to 200 W for instance, and preferably to 80 W when etching is started, etching is performed while setting the self-bias when plasma is formed at this time to 50 V to 300 V for instance, preferably to 250 V, and heavy atoms or molecules formed into plasma are made to have high energy.

Figure 6A:
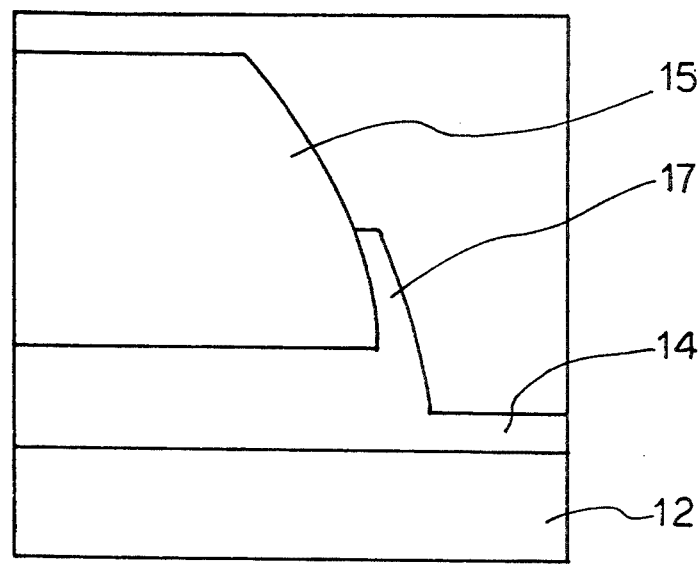
FIG. 6(a) is a sectional view depicted based on a photograph showing midway of patterning an electrode in a manufacturing process of an embodiment of the present invention.

Since WSi etched and sublimated is redeposited on respective side walls of the SiON film 15 and the WSi film 14 which remains thereunder without being etched, these side walls are covered by a WSi redeposited film 17. FIG. 6(a) is obtained by photographing the state shown in FIG. 4(d) and depicting it based on the photograph.

The etching in this case is continued until the thickness of the WSi film remaining on the semiconductor surface reaches the thickness equal to or thinner than the thickness of the WSi redeposited film 17 as shown in FIG. 4(d), and is stopped thereafter. The period of time for etching required for the thickness thereof to become equal to 300Å is approximately 17 minutes under preferable conditions.

Here, since the WSi film 14 remains on the surface of the AlGaAs layer 12, atoms or molecules having high energy are not introduced into the AlGaAs layer 12 while the metallic film 14 is being etched by atoms or molecules having high energy, but all the atoms or molecules can be protected by the remaining WSi film 14. Accordingly, the WSi film 14 existing from the beginning of film formation under the SiON film 15 become almost perpendicular from the side surface of the pattern of the SiON film 15, and moreover, it is possible to form an electrode having a sharp configuration without introducing damage into the AlGaAs layer 12 at all. Besides, the resist pattern 16 is removed by etching at this time.

Figure 4E:
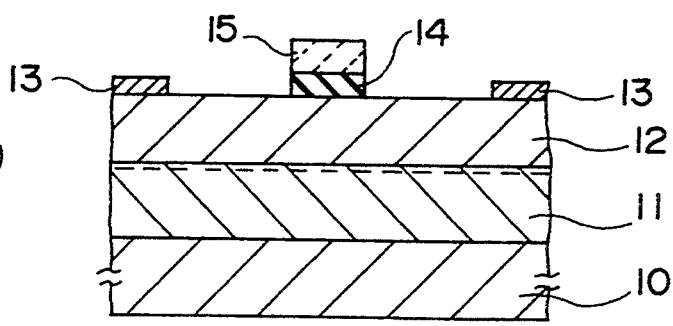

Next, the supply of the etching gas is stopped and then the gas which has remained in the etching chamber 31 is exhausted. Thereafter, as the gas for etching the WSi film 14 isotropically, gas having light atomic weight or molecular weight, having comparatively small bonding energy and generating a large amount of radicals such as sulfur hexafluoride ($SF_6$) is introduced into the etching chamber 31 at a flow rate of 5.0 sccm for instance, and the WSi film 14 of the area which is not covered by the resist pattern 16 is removed by etching as shown in FIG. 4(e).

In this case, the pressure in the etching chamber 31 is lowered so as to regulate it to show, for example, 0.01 to 0.6 Pa, and preferably 0.3 Pa. Furthermore, when the discharge power of the high frequency power source $R_f$ is reduced to 40 W for instance and etching is applied after reducing the self-bias at this time to 10 V to 80 V for instance, and preferably to 50 V, formation of the gate electrode is completed.

According to such isotropic etching, the chemical reaction becomes dominant and the WSi film 14 is etched isotropically. Therefore, even when the etchant thereof reaches the surface of the AlGaAs (semiconductor layer) 12, the etchant scarcely damages the surface. Moreover, the etching thereof being isotropic, the WSi redeposited film 17 redeposited on the side wall of the WSi film 14 and the side wall of the SiON film 15 is removed at the same time.

Figure 6B:
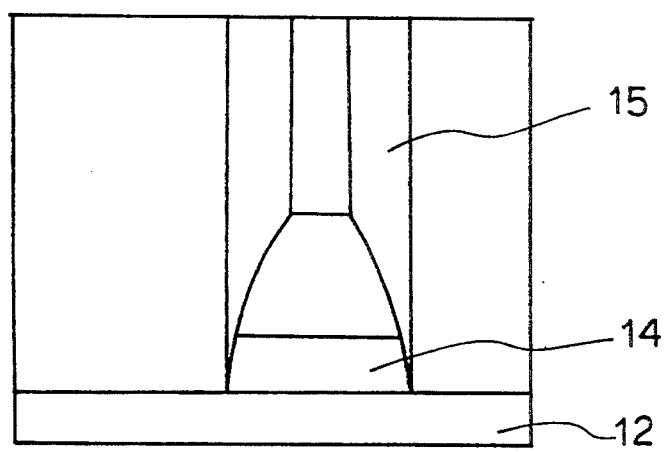
FIG. 6(b) is a sectional view depicted based on a photograph showing a state after completing the patterning.

In this case, the WSi redeposited film 17 has a film thickness equal to or thinner than that of the WSi film 14 on the AlGaAs layer 12 in an area which is not covered by the SiON film 15. Accordingly, the WSi film 14 which is in existence from the beginning of film formation under the SiON film 15 does not get narrower than the pattern of the SiON film 15, and a very steep configuration is realized at the border portion between the WSi film 14 which becomes a gate electrode and the surface of the AlGaAs layer 12 which is a semiconductor layer, thus completing a gate electrode. FIG. 6(b) shows the state of FIG. 4(e) photographed and depicted based on the photograph.

Figure 4F:
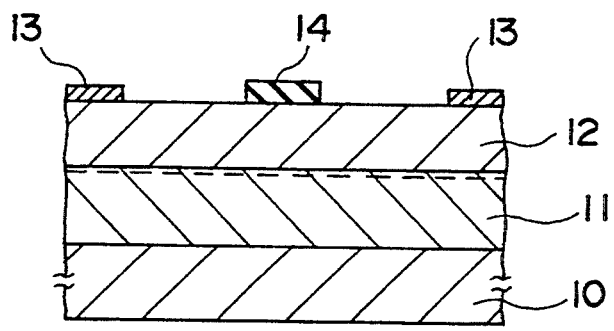
Figure 4G:
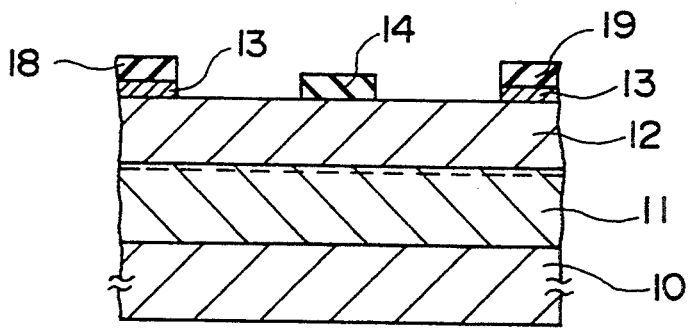

Then, etching is stopped when the WSi film 14 remaining on the surface of the AlGaAs layer 12 without being covered by the SiON film 15 disappears. Then, the substrate 10 is taken out of the etching chamber 31 after exhausting remaining gas completely, and thereafter, a source electrode 18 and a drain electrode 19 in ohmic contact with the InGaAs layer 13 which is a cap layer are formed as shown in FIG. 4(g) after removing the SiON film 15 by hydrofluoric acid as shown in FIG. 4(f). AuGe/Au for instance is available as the materials of these electrodes. Besides, a reference numeral 20 in the figure represents two-dimensional electron gas.

Hereupon, in the above-mentioned HEMT, the gate electrode is formed of WSi, but a refractory metallic film such as Mo or refractory metallic silicide may also be adopted. In this case, when the pressure of the ambient atmosphere in anisotropic etching is set high so as to redeposit the metal on the side wall of the gate electrode, and the unnecessary metallic film is removed completely thereafter by isotropic etching, a good configuration is obtainable and damage of the semiconductor can be prevented.

Further, in the above-mentioned semiconductor element, a GaAs layer is formed on a semi-insulating substrate as an electron travelling layer and an AlGaAs layer is formed thereon as an electron supply layer. However, a thin InGaAs layer may be grown between these layers, and also an InP substrate is used as the semi-insulating substrate and an InAlAs electron travelling layer and an InAlAs electron supply layer may be formed thereon. In particular, the materials of the semiconductor are not limited specifically.

Further, a HEMT has been described in the above-mentioned embodiment, which, however, is not limited thereto. The present invention may also be applied similarly to patterning of an electrode such as an element provided with a construction in which a semiconductor layer and an electrode come into Schottky contact with each other like a Metal-Semiconductor (MES) construction such as a GaAs MESFET, and an element provided with an electrode formed on a semiconductor layer through an insulating film like a Metal-Insulator-Semiconductor (MIS) construction.

Further, in order to restrain damages on a semiconductor layer in forming an electrode, the present invention may be applied similarly to a semiconductor device utilizing an element semiconductor such as silicon and germanium.

What is claimed is:

1. A method of forming an electrode in a semiconductor device, comprising the steps of:
    forming a conductive film for forming an electrode on a semiconductor layer;
    forming a mask pattern on said conductive film;
    applying anisotropic etching in a substantially perpendicular direction to said conductive film by a first etchant using said mask pattern as a mask in a first reduced pressure ambient atmosphere so as to form the conductive film into a thin layer, and redepositing conductive film materials sublimated by etching on the side portion of said conductive film in an area under said mask pattern; and
    thereafter removing said conductive film in an area which is not covered by said mask pattern by isotropic etching using a second etchant, and etching said conductive film materials redeposited on the side portion of said conductive film under said mask pattern to thereby complete said electrode, wherein said second etchant has a lower energy than that of said first etchant.

2. A method of forming an electrode in a semiconductor device according to claim 1, wherein said second etchant having lower energy than that of said first etchant in a second pressure ambient atmosphere where pressure is reduced lower than said first pressure ambient atmosphere is used.

3. A method of forming an electrode in a semiconductor device according to claim 1, wherein atomic weight, molecular weight and bonding energy of the molecules of said first etchant are larger than atomic weight, molecular weight and bonding energy of the molecules of said second etchant.

4. A method of forming an electrode in a semiconductor device according to claim 1, wherein the film thickness of said conductive film immediately after said anisotropic etching is the same as the thickness of said conductive materials redeposited on a side wall of a conductive film located under said mask pattern.

5. A method of forming an electrode in a semiconductor device according to claim 1, wherein said isotropic etching is etching in which a chemical reaction is dominant.

6. A method of forming an electrode in a semiconductor device according to claim 1, wherein said semiconductor layer is composed of one of a compound semiconductor and an elemental semiconductor.

7. A method of forming an electrode in a semiconductor device according to claim 1, wherein said conductive film is composed of one of refractory metal and refractory metal silicide.

8. A method of forming an electrode in a semiconductor device according to claim 1, wherein said electrode and said semiconductor layer are in Schottky contact with each other.

9. A method of forming an electrode in a semiconductor device according to claim 1, wherein said semiconductor layer is an electron supply layer of a high electron mobility transistor, and said electrode is a gate electrode of a high electron mobility transistor which comes into Schottky contact with said semiconductor layer.

10. A method of forming an electrode in a semiconductor device according to claim 1, wherein said semiconductor layer is an AlGaAs layer, said conductive film is a WSi film, said first etchant is gas containing $CF_4$, said second etchant is gas containing $SF_6$, the pressure of said first low pressure ambient atmosphere is 0.5 Pa and the pressure of said second low pressure ambient atmosphere is 0.3 Pa.

11. A method of forming an electrode in a semiconductor device according to claim 1, wherein an insulating film thinner than said conductive film is formed between said semiconductor layer and said conductive film.

* * * * *